(12) United States Patent
Eto et al.

(10) Patent No.: US 11,773,324 B2
(45) Date of Patent: Oct. 3, 2023

(54) SEMICONDUCTOR PROCESSING LIQUID AND METHOD FOR PROCESSING SUBSTRATE

(71) Applicant: TOKYO OHKA KOGYO CO., LTD., Kawasaki (JP)

(72) Inventors: Takahiro Eto, Kawasaki (JP); Lihong Liu, Hillsboro, OR (US)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 0 days.

(21) Appl. No.: 17/812,587

(22) Filed: Jul. 14, 2022

(65) Prior Publication Data

US 2022/0372369 A1 Nov. 24, 2022

Related U.S. Application Data

(62) Division of application No. 17/181,352, filed on Feb. 22, 2021.

(60) Provisional application No. 62/991,590, filed on Mar. 19, 2020.

(51) Int. Cl.
| | |
|---|---|
| *C09K 13/04* | (2006.01) |
| *H01L 21/306* | (2006.01) |
| *C09K 13/06* | (2006.01) |
| *H01L 21/3213* | (2006.01) |
| *C09K 13/00* | (2006.01) |
| *C09K 13/08* | (2006.01) |
| *H01L 21/311* | (2006.01) |
| *H01L 21/02* | (2006.01) |

(52) U.S. Cl.
CPC .............. *C09K 13/04* (2013.01); *C09K 13/00* (2013.01); *C09K 13/06* (2013.01); *C09K 13/08* (2013.01); *H01L 21/02052* (2013.01); *H01L 21/02057* (2013.01); *H01L 21/30604* (2013.01); *H01L 21/31111* (2013.01); *H01L 21/32133* (2013.01); *H01L 21/32134* (2013.01)

(58) Field of Classification Search
None
See application file for complete search history.

(56) References Cited

U.S. PATENT DOCUMENTS

| | | |
|---|---|---|
| 2016/0053384 A1 | 2/2016 | Adaniya et al. |
| 2016/0185595 A1 | 6/2016 | Chen et al. |
| 2017/0309492 A1 | 10/2017 | Takahashi et al. |

FOREIGN PATENT DOCUMENTS

| | | | | |
|---|---|---|---|---|
| EP | 1150342 | * 10/2001 | ........... | H01L 21/306 |
| JP | 2006-098421 A | 4/2006 | | |
| JP | 2007-150118 A | 6/2007 | | |
| JP | 2015-108041 A | 6/2015 | | |
| KR | 2015-0112498 A | 10/2015 | | |
| KR | 20150112498 | * 10/2015 | ............. | C09K 13/08 |

OTHER PUBLICATIONS

Office Action in U.S. Appl. No. 17/181,352 dated Jul. 9, 2021.
Final Office Action in U.S. Appl. No. 17/181,352 dated Nov. 9, 2021.
Office Action in U.S. Appl. No. 17/181,352 dated Mar. 21, 2022.

* cited by examiner

*Primary Examiner* — Jiong-Ping Lu
(74) *Attorney, Agent, or Firm* — Knobbe, Martens, Olson & Bear, LLP

(57) ABSTRACT

A semiconductor processing liquid including hydrofluoric acid, and an organic solvent, in which the organic solvent contains a compound represented by the formula below in which $X_1$ is a single bond or an alkylene group having 1 to 6 carbon atoms, in which an ether bond may be interposed, $Y_{10}$ is one of —O—, —(C=O)—, —O—(C=O)—, and —(C=O)—O—, $Y_{20}$ is one of —(C=O)—, —O—(C=O)—, and —(C=O)—O—, and $Y_{11}$ and $Y_{21}$ are each independently a single bond or an alkylene group having 1 to 6 carbon atoms in which an ether bond may be interposed, provided that, $X_1$, $Y_{11}$, and $Y_{21}$ do not contain hydroxyl groups in structures thereof, and when $X_1$ is a single bond, $Y_{10}$ is not —O—)

$$H_3C-Y_{11}-Y_{10}-X_1-Y_{20}-Y_{21}-CH_3 \qquad (1).$$

5 Claims, No Drawings

SEMICONDUCTOR PROCESSING LIQUID AND METHOD FOR PROCESSING SUBSTRATE

This application is a divisional of U.S. patent application Ser. No. 17/181,352, filed Feb. 22, 2021, which claims priority to U.S. Provisional Application No. 62/991,590, filed Mar. 19, 2020, the content of which is incorporated herein by reference.

BACKGROUND OF THE INVENTION

Field of the Invention

The present invention relates to a semiconductor processing liquid and a method for processing a substrate.

Description of Related Art

In the manufacturing of semiconductor elements such as ICs and LSIs and liquid crystal panel elements, first, a conductive metal film deposited by CVD or an insulating film such as a $SiO_2$ film is formed on a substrate such as a silicon wafer or glass. Next, a photoresist is uniformly coated onto the conductive metal film or the insulating film and selectively exposed and subjected to a development process to form a photoresist pattern. Then, using this pattern as a mask, the conductive metal film or the insulating film is selectively etched to form a fine circuit, and then an unnecessary photoresist layer is removed with a stripping solution to carry out the manufacturing.

Materials for performing such selective etching are widely studied in the related art. For example, Japanese Unexamined Patent Publication No. 2007-150118 discloses a chemical solution in which hydrogen fluoride and two types of solvent satisfying specific requirements are combined as a microfabrication processing agent capable of selectively microfabricating only a high dielectric constant film.

In addition, Japanese Unexamined Patent Publication No. 2015-108041 discloses a cleaning composition including a fluorine-containing compound and hexafluoroisopropyl alcohol (1,1,1,3,3,3-hexafluoro-2-propanol) and that such a cleaning composition makes it possible to obtain a material capable of selectively etching a boron phosphorus glass film with respect to a thermal oxide film.

CITATION LIST

Patent Document

[Patent Document 1]
Japanese Unexamined Patent Publication No. 2007-150118
[Patent Document 2]
Japanese Unexamined Patent Publication No. 2015-108041

SUMMARY OF THE INVENTION

However, the miniaturization of wiring in semiconductor substrates has progressed further in recent years, creating a situation in which it is difficult to selectively etch only a desired region with the semiconductor processing liquids of the related art.

The present invention was made in view of the above problems and has an object of providing a semiconductor processing liquid capable of processing, with high selectivity, only a desired material among various types of constituent materials present in a semiconductor substrate.

In order to solve the problems described above, the present inventors conducted intensive research focusing on the components contained in the semiconductor processing liquid. As a result, it was found that it is possible to solve the problems described above through the inclusion of a specific organic solvent, thereby completing the present invention. More specifically, the present invention provides the following.

The present invention provides a semiconductor processing liquid including hydrofluoric acid (A), and an organic solvent (B), in which the organic solvent (B) contains a compound represented by Formula (1).

[Chemical Formula 1]

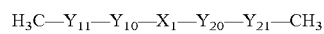  (1)

[In Formula (1), $X_1$ is a single bond or an alkylene group having 1 to 6 carbon atoms, in which an ether bond may be interposed, $Y_{10}$ is one selected from the group consisting of —O—, —(C=O)—, —O—(C=O)—, and —(C=O)—O—, $Y_{20}$ is one selected from the group consisting of —(C=O)—, —O—(C=O)—, and —(C=O)—O—, $Y_{11}$ and $Y_{21}$ are each independently a single bond or an alkylene group having 1 to 6 carbon atoms in which an ether bond may be interposed, provided that $X_1$, $Y_{11}$, and $Y_{21}$ do not contain hydroxyl groups in structures thereof, and, when $X_1$ is a single bond, $Y_{10}$ is not —O—.]

In addition, the present invention provides a method for processing a substrate including a step of bringing the semiconductor processing liquid described above into contact with a semiconductor substrate.

According to the present invention, there is provided a semiconductor processing liquid capable of processing, with high selectivity, only a desired material among various types of constituent materials present in a semiconductor substrate.

DETAILED DESCRIPTION OF THE INVENTION

A detailed description will be given below of embodiments of the present invention, but the present invention is not limited to the following embodiments and is able to be implemented by adding appropriate modifications within the range of the object of the present invention.

(Semiconductor Processing Liquid)

A semiconductor processing liquid according to a first aspect of the present invention includes hydrofluoric acid (A) and an organic solvent (B).

<Hydrofluoric Acid (A)>

The semiconductor processing liquid according to the present embodiment includes hydrofluoric acid (DHF).

The content ratio of hydrofluoric acid in the entire semiconductor processing liquid is preferably 0.001% by mass or more and 1.0% by mass or less, more preferably 0.005% by mass or more and 0.5% by mass or less, even more preferably 0.01% by mass or more and 0.3% by mass or less, and yet more preferably 0.05% by mass or more and 0.2% by mass or less.

When the content of hydrofluoric acid is within the above ranges, the etching selectivity with respect to, for example, a boron phosphorus glass film (BPSG) is easily improved. In addition, when the content of hydrofluoric acid is within the above ranges, the uniformity of etching in the wafer is easily improved.

<Organic Solvent (B)>

The organic solvent (B) includes a compound represented by Formula (1) (may be referred to below as "compound (1)").

[Chemical Formula 2]

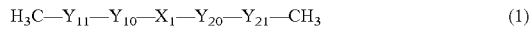

$$H_3C—Y_{11}—Y_{10}—X_1—Y_{20}—Y_{21}—CH_3 \quad (1)$$

[In Formula (1), $X_1$ is a single bond or an alkylene group having 1 to 6 carbon atoms, in which an ether bond may be interposed, $Y_{10}$ is one selected from the group consisting of —O—, —(C=O)—, —O—(C=O)—, and —(C=O)—O—, $Y_{20}$ is one selected from the group consisting of —(C=O)—, —O—(C=O)—, and —(C=O)—O—, $Y_{11}$ and $Y_{21}$ are each independently a single bond or an alkylene group having 1 to 6 carbon atoms in which an ether bond may be interposed, provided that, $X_1$, $Y_{11}$, and $Y_{21}$ do not contain hydroxyl groups in structures thereof, and, when $X_1$ is a single bond, $Y_{10}$ is not —O—.]

In Formula (1), examples of the alkylene group having 1 to 6 carbon atoms in $X_1$ include a linear alkylene group and a branched chain alkylene group.

Examples of the linear alkylene group include a methylene group [—CH$_2$—], an ethylene group [—(CH$_2$)$_2$—], a trimethylene group [—(CH$_2$)$_3$—], a tetramethylene group [—(CH$_2$)$_4$—], a pentamethylene group [—(CH$_2$)$_5$—], a hexamethylene group [—(CH$_2$)$_6$-] and the like.

Examples of the branched chain alkylene group include alkylalkylene groups such as alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; alkyltetramethylene groups such as —CH(CH$_3$)CH$_2$CH$_2$CH$_2$—, and —CH$_2$CH(CH$_3$)CH$_2$CH$_2$, and the like.

Among the above, as $X_1$, a single bond, a methylene group [—CH$_2$—], an ethylene group [—(CH$_2$)$_2$—], and a trimethylene group [—(CH$_2$)$_3$-] or —CH(CH$_2$CH$_3$)—, —CH(CH$_3$)CH$_2$CH$_2$—, —CH$_2$CH$_2$—O—CH$_2$CH$_2$— or —CH(CH$_2$CH$_3$)— are preferable.

In Formula (1), $Y_{10}$ is one selected from the group consisting of —O—, —(C=O)—, —O—(C=O)—, and —(C=O)—O—, and —O—, —(C=O)—, or —O—(C=O)— is preferable. However, in a case where $X_1$ is a single bond, $Y_{10}$ is not —O—.

In Formula (1), $Y_{20}$ is one selected from the group consisting of —(C=O)—, —O—(C=O)—, and —(C=O)—O—.

In Formula (1), examples of the alkylene groups having 1 to 6 carbon atoms in which an ether bond may be interposed in $Y_{11}$ and $Y_{21}$ include alkylene groups having 1 to 6 carbon atoms in $X_1$, groups in which an ether group is interposed in an alkylene group having 1 to 6 carbon atoms in $X_1$, and the like.

Among these, as $Y_{11}$, a single bond, a methylene group [—CH$_2$—], a trimethylene group [—(CH$_2$)$_3$—], —O—CH$_2$— or —O—C$_3$H$_6$— is preferable.

As $Y_{21}$, a single bond or a methylene group [—CH$_2$-] is preferable.

Among these, as compound (1), at least one type selected from the group consisting of diethyl oxalate, diethyl malonate, diethyl succinate, propylene glycol monomethyl ether acetate, dipropylene glycol methyl ether acetate, acetylacetone, 3-methoxy-3-methyl-1-butyl acetate, 3-methoxy-1-butylacetate, diethyleneglycol monobutyl ether acetate and propyleneglycol diacetate is preferable.

As the compound (1), one type may be used alone, or two or more types may be used in combination.

The ratio of the compound (1) in the organic solvent (B) is preferably 50% by mass or more with respect to the total mass of the organic solvent (B), more preferably 75% by mass or more, and may be 100% by mass.

The organic solvent (B) may contain an organic solvent other than the compound (1).

Examples of organic solvents other than the compound (1) include organic carboxylic acid solvents (for example, acetic acid, formic acid, and the like), alcohol-based solvents (for example, methanol, ethanol, ethylene glycol, propylene glycol, glycerin, 1,3-propanediol, 1,3-butanediol, 1,4-butanediol, diethylene glycol, dipropylene glycol, furfuryl alcohol, and 2-methyl-2,4-pentanediol, and the like), dimethyl sulfoxide, ether-based solvents (for example, tetrahydrofuran, ethylene glycol dimethyl ether, diethylene glycol dimethyl ether, triethylene glycol dimethyl ether, tetraethylene glycol dimethyl ether, and propylene glycol dimethyl ether), acetone, acetonitrile, and the like.

The ratio of the organic solvent (B) in the entire semiconductor processing liquid of the present embodiment is preferably 70% by mass or more and 99.999% by mass or less, more preferably 80% by mass or more and 99.99% by mass or less, even more preferably 90% by mass or more and 99.95% by mass or less, and yet more preferably 95% by mass or more and 99.9% by mass or less.

When the content of hydrofluoric acid is within the above ranges, the etching selectivity with respect to, for example, a boron phosphorus glass film (BPSG) is improved.

<Other Components>

The semiconductor processing liquid of the present embodiment may include other components in addition to the components described above in a range in which the effects of the present invention are not impaired. Examples of other components include water, a pH adjuster, a surfactant, an oxidizing agent, and the like.

Water (W)

The semiconductor processing liquid of the present embodiment preferably includes water as a solvent for the components described above. Water may include trace components which are inevitably mixed therein. The water used for the semiconductor processing liquid of the present embodiment is preferably water subjected to a purification treatment such as distilled water, ion-exchanged water, and ultrapure water, and more preferably ultrapure water generally used for semiconductor manufacturing.

The content of water in the semiconductor processing liquid of the present embodiment is not particularly limited, but is preferably 0.001% by mass or more, more preferably 0.01% by mass or more, and even more preferably 0.05% by mass or more. In addition, the upper limit value is not particularly limited, but is preferably less than 1.0% by mass, more preferably 0.5% by mass or less, and even more preferably 0.3% by mass or less.

When the water content is within the range described above, the etching selectivity with respect to, for example, a boron phosphorus glass film (BPSG) is more easily improved.

pH Adjuster

The semiconductor processing liquid of the present embodiment may include a pH adjuster within a range which does not impair the object of the present invention. As the pH adjuster, at least one type selected from the group consisting of acids and salts thereof is preferable. Specifically, examples thereof include methanesulfonic acid, trifluoromethanesulfonic acid, oxalic acid dihydrate, citric acid, tartaric acid, picolinic acid, succinic acid, acetic acid, lactic acid, sulfosuccinic acid, benzoic acid, propionic acid, formic acid, pyruvate, maleic acid, malonic acid, fumaric acid, malic acid, ascorbic acid, mandelic acid, heptanic acid, butyric acid, valeric acid, glutaric acid, phthalic acid, hypophosphoric acid, salicylic acid, 5-sulfosalicylic acid, hydrochloric acid, ethanesulfonic acid, butane sulfonic acid, p-toluene sulfonic acid, dichloroacetic acid, difluoroacetic acid, monochloroacetic acid, monofluoroacetic acid, trichloroacetic acid, trifluoroacetic acid, hydrobromic acid (62% by weight), sulfuric acid, ammonium acetate, sodium acetate, potassium acetate, tetramethylammonium acetate and other tetraalkylammonium acetate, phosphonium acetate, ammonium butyrate, ammonium trifluoroacetate, ammonium carbonate, ammonium chloride, ammonium sulfate, phosphoric acid, diammonium hydrogen phosphate, ammonium dihydrogen phosphate, hydrogen phosphate bis(tetramethylammonium), disodium hydrogen phosphate, sodium dihydrogen phosphate, dipotassium hydrogen phosphate, potassium dihydrogen phosphate, ditetraalkylammonium hydrogen phosphate, ditetraalkylammonium dihydrogen phosphate, diphosphonium hydrogen phosphate, phosphonium dihydrogen phosphate, ammonium phosphonate, tetraalkylammonium phosphonate, sodium phosphonate, potassium phosphonate, phosphonium phosphonate, etidronic acid, and salts thereof, and the like.

In addition, the semiconductor processing liquid of the present embodiment may include a basic compound as a pH adjuster. It is possible to use organic alkaline compounds and inorganic alkaline compounds as such basic compounds and suitable examples of the organic alkaline compound include quaternary ammonium salts including organic quaternary ammonium hydroxides, salts of alkylamines such as trimethylamine and triethylamine and derivatives thereof.

In addition, examples of inorganic alkaline compounds include inorganic compounds including alkali metals or alkaline earth metals and salts thereof. Examples thereof include lithium hydroxide, sodium hydroxide, potassium hydroxide, rubidium hydroxide, cesium hydroxide, and the like.

In the semiconductor processing liquid of the present embodiment, one type of pH adjuster may be used alone, or two or more types may be used in combination.

In a case where the semiconductor processing liquid of the present embodiment includes a pH adjuster, the content of the pH adjuster is, for example, 0.01 to 10% by mass with respect to the total mass of the semiconductor processing liquid, preferably 0.02 to 4.5% by mass, more preferably 0.03 to 4% by mass, and even more preferably 0.05 to 3% by mass.

Passivation Agent

The semiconductor processing liquid of the present embodiment may include a passivation agent for germanium.

Examples of passivation agents include ascorbic acid, L(+)-ascorbic acid, isoascorbic acid, ascorbic acid derivatives, boric acid, ammonium diborate, borate (for example, ammonium pentaborate, sodium tetraborate, and ammonium diborate), alanine, arginine, asparagine, aspartic acid, cysteine, glutamate, glutamine, histidine, isoleucine, leucine, lysine, methionine, phenylalanine, proline, serine, threonine, tryptophan, tyrosine, valine, sodium bromide, potassium bromide, rubidium bromide, magnesium bromide, calcium bromide, ammonium bromide having the formula $NR^1R^2R^3R^4Br$ (in the formula, $R^1$, $R^2$, $R^3$ and $R^4$ may be the same or different from each other and are selected from the group consisting of hydrogen and branched or straight chain alkyls having 1 to 6 carbon atoms (for example, methyl, ethyl, propyl, butyl, pentyl, or hexyl)), or the like.

In the semiconductor processing liquid of the present embodiment, one type of passivation agent may be used alone, or two or more types may be used in combination.

In a case where the semiconductor processing liquid of the present embodiment includes a passivation agent, for example, 0.01 to 5% by mass with respect to the total mass of the semiconductor processing liquid is preferable, and 0.1 to 1% by mass is more preferable.

Surfactant

The semiconductor processing liquid of the present embodiment may include a surfactant for the purpose of adjusting the wettability of the semiconductor processing liquid with respect to the object to be processed, or the like. As the surfactant, it is possible to use a nonionic surfactant, an anionic surfactant, a cationic surfactant, or an amphoteric surfactant, and these may be used in combination.

Examples of nonionic surfactants include polyalkylene oxide alkylphenyl ether surfactants, polyalkylene oxide alkyl ether surfactants, block polymer surfactants formed of polyethylene oxide and polypropylene oxide, polyoxyalkylene distyrenated phenyl ether surfactants, polyalkylene tribenzylphenyl ether surfactants, acetylene polyalkylene oxide surfactants, and the like.

Examples of anionic surfactants include alkyl sulfonic acid, alkyl benzene sulfonic acid, alkyl naphthalene sulfonic acid, alkyl diphenyl ether sulfonic acid, fatty acid amide sulfonic acid, polyoxyethylene alkyl ether carboxylic acid, polyoxyethylene alkyl ether acetic acid, polyoxyethylene alkyl ether propionic acid, alkyl phosphonic acid, fatty acid salts, and the like. Examples of "salts" include ammonium salt, sodium salt, potassium salt, tetramethylammonium salt, and the like.

Examples of cationic surfactants include a quaternary ammonium salt surfactant or an alkyl pyridium surfactant or the like.

Examples of amphoteric surfactants include betaine surfactants, amino acid surfactants, imidazoline surfactants, amine oxide surfactants, and the like.

These surfactants are generally commercially available. One type of surfactant may be used alone, or two or more types may be used in combination.

The semiconductor processing liquid of the present embodiment has a pH of preferably 2.0 or less, more preferably 1.8 or less, even more preferably 1.5 or less, and yet more preferably 1.2 or less.

Due to the pH of the semiconductor processing liquid being within the preferable range described above, the etching selectivity with respect to, for example, a boron phosphorus glass film (BPSG) is more easily improved.

The semiconductor processing liquid of the present embodiment has a fluorine ion concentration of preferably 1 ppm or more and 1000 ppm or less, more preferably 5 ppm or more and 500 ppm or less, and even more preferably 10 ppm or more and 300 ppm or less.

When the content of hydrofluoric acid is within the range described above, the etching selectivity with respect to, for example, a boron phosphorus glass film (BPSG) is more easily improved.

The semiconductor processing liquid of the present embodiment is preferably applied as an etching liquid.

In addition, it is also possible to apply the semiconductor processing liquid of the present embodiment to, for example, the processing of residues after dry etching.

In a case where the semiconductor processing liquid of the present embodiment is applied as an etching liquid, a ratio (BPSG/TEOS) of the etching rate of a boron phosphorus glass film (BPSG) at 25° C. with respect to the etching rate of the thermal oxide film (TEOS) at 25° C. is preferably 250 or more, more preferably 260 or more, even more preferably 270 or more, and yet more preferably 300 or more.

When the BPSG/TEOS ratio is within the preferable range described above, the etching selectivity with respect to BPSG is good.

The semiconductor processing liquid of the present embodiment includes hydrofluoric acid (A) and an organic solvent (B), and includes at least a compound (compound (1)) represented by Formula (1) as the organic solvent (B).

The compound (1) includes a carbonyl group or a carboxy group in the structure thereof and does not include a hydroxyl group. Therefore, the semiconductor processing liquid of the present embodiment has appropriate hydrophilicity, the hydrofluoric acid is appropriately dissociated into hydrogen ions and fluorine ions, and it is possible to process, with high selectivity, only a desired material.

(Method for Processing Substrate)

The method for processing a substrate according to the present embodiment includes a step of bringing the semiconductor processing liquid into contact with a semiconductor substrate. The semiconductor substrate is not particularly limited and examples thereof include various substrates such as a semiconductor wafer, a glass substrate for a photomask, a glass substrate for a liquid crystal display, a glass substrate for a plasma display, a substrate for a Field Emission Display (FED), a substrate for an optical disc, a substrate for a magnetic disk, and substrate for a magneto-optical disc. As the substrate, a substrate used for semiconductor device production is preferable. Typically, a thermal oxide film (TEOS), a boron phosphorus glass film (BPSG), or the like is formed on the substrate. In addition, the substrate may have various layers and structures as appropriate, such as, for example, metal wiring, a gate structure, a source structure, a drain structure, an insulating layer, a ferromagnetic layer, and a non-magnetic layer.

The size, thickness, shape, layer structure, and the like of the substrate are not particularly limited and appropriate selection according to the purpose is possible.

Examples of the step of bringing the semiconductor processing liquid into contact with the semiconductor substrate include a step of etching the semiconductor substrate using the semiconductor processing liquid, a step of bringing the semiconductor processing liquid into contact with the surface of the semiconductor substrate after dry etching and removing the residue on the semiconductor substrate, and the like.

The etching process method is not particularly limited and it is possible to use a known etching method. Examples of such methods include a spray method, an immersion method, a liquid filling method, or the like, without being limited thereto.

In the spray method, for example, the semiconductor substrate is transported or rotated in a predetermined direction, the semiconductor processing liquid is ejected into the space such that the semiconductor processing liquid is brought into contact with the semiconductor substrate. As necessary, the semiconductor processing liquid may be sprayed while rotating the substrate using a spin coater.

In the immersion method, the semiconductor substrate is immersed in the semiconductor processing liquid and the semiconductor processing liquid is brought into contact with the semiconductor substrate.

In the liquid filling method, the semiconductor processing liquid is filled in the semiconductor substrate and the semiconductor substrate and the semiconductor processing liquid are brought into contact with each other.

It is possible to appropriately select these etching process methods depending on the structure, materials, and the like of the semiconductor substrate. In a case of the spray method or the liquid filling method, the amount of the semiconductor processing liquid supplied to the semiconductor substrate may be any amount by which the surface to be processed in the semiconductor substrate is sufficiently wetted by the semiconductor processing liquid.

The purpose of the etching process is not particularly limited and may be microfabrication processing for a semiconductor substrate surface to be processed including material to be processed, may be removal of a deposit attached to the semiconductor substrate, or may be cleaning of a semiconductor substrate surface to be processed including a coating film.

The temperature at which the etching process is performed is not particularly limited as long as the temperature is a temperature at which the material to be processed dissolves in the semiconductor processing liquid. Examples of the temperature for the etching process include 15° C. to 60° C. In a case of any of the spray method, the immersion method, and the liquid filling method, the etching rate is increased by increasing the temperature of the semiconductor processing liquid, but it is possible to appropriately select the processing temperature in consideration of suppressing composition changes in the semiconductor processing liquid to be small, or workability, safety, cost, and the like.

The time for performing the etching process may be appropriately selected according to the purpose of the etching process, the amount of the material to be processed to be removed by the etching (for example, the thickness of the layer containing the material to be processed, the amount of the deposits of material to be processed, and the like), and the etching process conditions.

<Other Steps>

The method for processing a substrate according to the present embodiment may include other steps in addition to the step of bringing the semiconductor processing liquid into contact with the semiconductor substrate. The other steps are not particularly limited and examples thereof include known steps performed when manufacturing a semiconductor element. Examples of such steps include a step of forming each structure such as channel formation, High-K/metal gate formation, a metal wiring, a gate structure, a source structure, a drain structure, an insulating layer, a ferromagnetic layer, and a non-magnetic layer (layer formation, etching other than the etching process described above, chemical mechanical polishing, modification, and the like), a resist film formation step, an exposure step, a development step, a heating process step, a cleaning step, an inspection step, and the like, without being limited thereto. It is possible to appropriately perform these other steps before or after the etching process step as necessary.

EXAMPLES

A more detailed description will be given below of the present invention with reference to Examples, but the present invention is not limited to these Examples.

<Preparation of Semiconductor Processing Liquid>

Examples 1 to 10, Comparative Examples 1 to 8

A 49% hydrofluoric acid aqueous solution was added to the organic solvents shown in Tables 1 to 3 to prepare semiconductor processing liquids for each Example.

[pH of Semiconductor Processing Liquid]

For the semiconductor processing liquid of each Example, the pH at 25° C. was measured using a pH meter. The results are shown in Tables 1 to 3.

[Fluorine Ion Concentration of Semiconductor Processing Liquid]

For the semiconductor processing liquid of each Example, the fluorine ion concentration at 25° C. was measured using a fluorine ion meter.

[Evaluation of Etching Selectivity]

The etching rate and selection ratio of each Example with respect to a test substrate on which a boron phosphorus glass film (BPSG) or a TEOS film was formed on the silicon substrate were determined. The etching rate was determined by measuring the film thickness of each film before and after etching using an ellipsometer. The etching rate of each etching liquid is calculated by etching each film using each etching liquid and dividing the difference in film thickness before and after etching by the etching time. The results are shown in Tables 1 to 3.

TABLE 1

|  | Example 1 | Example 2 | Example 3 | Example 4 |
| --- | --- | --- | --- | --- |
| Organic solvent | Diethyl oxalate | Diethyl malonate | Diethyl succinate | Propylene glycol monomethyl ether acetate |
|  | 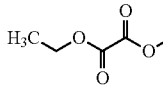 | 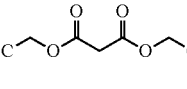 | 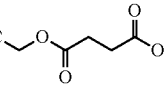 | 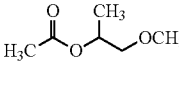 |
| pH | 1.1 | 0.9 | 0.7 | 0.5 |
| Fluorine ion concentration (ppm) | 50 | 100 | 30 | 10 |
| BPSG etching rate (Å/min) | 49.3 | 39.5 | 39.2 | 43.5 |
| TEOS etching rate (Å/min) | 0.10 | 0.09 | 0.09 | 0.09 |
| BPSG/TEOS etching selectivity | 490 | 440 | 435 | 485 |

|  | Example 5 | Example 6 | Example 7 |
| --- | --- | --- | --- |
| Organic solvent | Propylene glycol methyl ether acetate | Acetylacetone | 3-methoxy-3-methyl-l-butyl acetate |
|  | 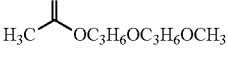 | 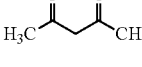 | 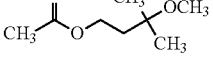 |
| pH | 1.0 | 0.2 | 0.2 |
| Fluorine ion concentration (ppm) | 210 | 170 | 290 |
| BPSG etching rate (Å/min) | 44.6 | 60.0 | 58.1 |
| TEOS etching rate (Å/min) | 0.12 | 0.15 | 0.19 |
| BPSG/TEOS etching selectivity | 370 | 400 | 305 |

TABLE 2

| | Example 8 | Example 9 | Example 10 |
|---|---|---|---|
| Organic solvent | 3-methoxy-1-butylacetate | diethyleneglycol monobutyl ether acetate | Propyleneglycol diacetate |
| | 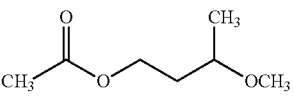 | 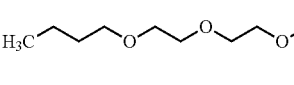 | 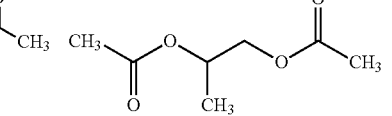 |
| PH | 0.2 | 0.3 | 0.8 |
| Fluorine ion concentration (PPm) | 270 | 160 | 150 |
| BPSG etching rate (Å/min) | 41.7 | 54.1 | 40.8 |
| TEOS etching rate (Å/min) | 0.11 | 0.15 | 0.10 |
| BPSG/TEOS etching selectivity | 320 | 350 | 410 |

TABLE 3

| | Comparative Example 1 | Comparative Example 2 | Comparative Example 3 | Comparative Example 4 |
|---|---|---|---|---|
| Organic solvent | Acetonitrile | Dipropylene glycol dimethyl ether | Triethylene glycol monomethyl ether | Propylene glycol monomethyl ether |
| | 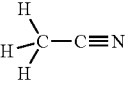 | CH$_3$OC$_3$H$_6$OC$_3$H$_6$OCH$_3$ | 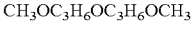 | 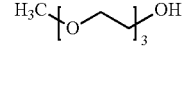 |
| pH | 0.0 | 1.0 | 3.9 | 4.5 |
| Fluorine ion concentration (ppm) | 20 | 1240 | 60 | 2670 |
| BPSG etching rate (Å/min) | 563.8 | 490.8 | 33.5 | 34.2 |
| TEOS etching rate (Å/min) | 2.68 | 2.39 | 0.25 | 0.24 |
| BPSG/TEOS etching selectivity | 210 | 205 | 133 | 145 |

| | Comparative Example 5 | Comparative Example 6 | Comparative Example 7 | Comparative Example 8 |
|---|---|---|---|---|
| Organic solvent | Diethylene glycol monomethyl ether | Tetraethylene glycol | Dimethyl imidazolidine | N-ethyl pyrrolidone |
| | CH$_3$OCH$_2$CH$_2$OCH$_2$CH$_2$OH | 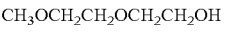 | 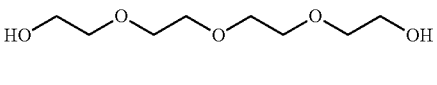 [SMILES: OCCOCCOCCOCCO] | 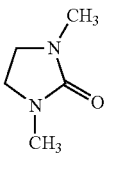 |
| pH | 7.5 | 7.7 | 5.8 | 10.1 |
| Fluorine ion concentration (ppm) | 570 | 1970 | >9999 | >9999 |
| BPSG etching rate (Å/min) | 31.4 | 28.2 | 7.9 | 2.1 |

TABLE 3-continued

| | | | | |
|---|---|---|---|---|
| TEOS etching rate (Å/min) | 0.23 | 0.38 | 1.04 | 0.13 |
| BPSG/TEOS etching selectivity | 136 | 73 | 7.6 | 16 |

From the results shown in Tables 1 to 3, it was confirmed that the semiconductor processing liquids of Examples 1 to 10 had improved BPSG etching selectivity in comparison with the semiconductor processing liquids of Comparative Examples 1 to 8.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for processing a substrate comprising:
bringing a semiconductor processing liquid into contact with a semiconductor substrate having a boron phosphorus glass film formed thereon,
the semiconductor processing liquid comprising:
hydrofluoric acid (A); and
an organic solvent (B),
wherein the organic solvent (B) contains a compound represented by Formula (1):

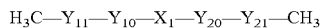

$$H_3C-Y_{11}-Y_{10}-X_1-Y_{20}-Y_{21}-CH_3 \quad (1)$$

wherein $X_1$ is a single bond or an alkylene group having 1 to 6 carbon atoms, in which an ether bond may be interposed,
$Y_{10}$ is one selected from the group consisting of —O—, —(C=O)—, —O—(C=O)—, and —(C=O)—O—,
$Y_{20}$ is one selected from the group consisting of —(C=O)—, —O—(C=O)—, and —(C=O)—O—,
$Y_{11}$ and $Y_{21}$ are each independently a single bond or an alkylene group having 1 to 6 carbon atoms in which an ether bond may be interposed,
provided that, $X_1$, $Y_{11}$, and $Y_{21}$ do not contain hydroxyl groups in structures thereof, and, when $X_1$ is a single bond, $Y_{10}$ is not —O—,
and wherein the semiconductor processing liquid has a pH of 1.2 or less.

2. The method according to claim 1, wherein a content of the organic solvent (B) is 70% by mass or more of the entire semiconductor processing liquid.

3. The method according to claim 1, wherein the semiconductor processing liquid further comprises water (W).

4. The method according to claim 1, wherein the semiconductor processing liquid is an etching liquid.

5. The s method according to claim 4, wherein a ratio (BPSG/TEOS) of an etching rate of a boron phosphorus glass film (BPSG) at 25° C. with respect to an etching rate of a thermal oxide film (TEOS) at 25° C. is 250 or more.

* * * * *